US007771533B2

(12) United States Patent
Tois et al.

(10) Patent No.: US 7,771,533 B2
(45) Date of Patent: Aug. 10, 2010

(54) ATOMIC-LAYER-CHEMICAL-VAPOR-DEPOSITION OF FILMS THAT CONTAIN SILICON DIOXIDE

(75) Inventors: Eva Tois, Espoo (FI); Suvi Haukka, Helsinki (FI); Marko Tuominen, Espoo (FI)

(73) Assignee: ASM International N.V., Almere (NL)

( * ) Notice: Subject to any disclaimer, the term of this patent is extended or adjusted under 35 U.S.C. 154(b) by 109 days.

(21) Appl. No.: 10/148,525

(22) PCT Filed: Dec. 4, 2000

(86) PCT No.: PCT/FI00/01072

§ 371 (c)(1),
(2), (4) Date: Aug. 27, 2002

(87) PCT Pub. No.: WO01/40541

PCT Pub. Date: Jun. 7, 2001

(65) Prior Publication Data

US 2003/0188682 A1    Oct. 9, 2003

(30) Foreign Application Priority Data

Dec. 3, 1999    (FI)    ................................. 19992616

(51) Int. Cl.
    C30B 25/00    (2006.01)
(52) U.S. Cl. ............................. 117/88; 117/84; 117/89; 117/93; 117/102; 117/104; 117/942; 117/944
(58) Field of Classification Search .................. 117/84, 117/88, 89, 93, 102, 104, 942, 944
    See application file for complete search history.

(56) References Cited

U.S. PATENT DOCUMENTS

| | | | |
|---|---|---|---|
| 4,467,238 A * | 8/1984 | Silverstein et al. ............. 313/25 |
| 5,187,241 A | 2/1993 | Buchwalter et al. |
| 5,480,818 A | 1/1996 | Matsumoto et al. ............ 437/40 |
| 5,496,582 A | 3/1996 | Mizutani et al. |
| 5,496,597 A * | 3/1996 | Soininen et al. .............. 427/584 |
| 5,505,991 A | 4/1996 | Schmid et al. |
| 5,536,673 A | 7/1996 | Hong et al. |
| 5,603,750 A * | 2/1997 | Sierakowski et al. .......... 75/743 |
| 5,759,903 A * | 6/1998 | Lehmann et al. ............. 438/386 |
| 5,891,744 A | 4/1999 | Lowrey et al. |
| 5,917,571 A * | 6/1999 | Shimada ....................... 349/138 |
| 5,928,791 A | 7/1999 | Rosenmayer |
| 5,972,430 A | 10/1999 | DiMeo, Jr. et al. |
| 6,006,763 A | 12/1999 | Mori et al. |
| 6,015,590 A | 1/2000 | Suntola et al. |
| 6,090,442 A * | 7/2000 | Klaus et al. ............. 427/255.15 |
| 6,174,809 B1 * | 1/2001 | Kang et al. .................. 438/682 |
| 6,203,613 B1 * | 3/2001 | Gates et al. .................. 117/104 |
| 6,207,487 B1 | 3/2001 | Kim et al. |
| 6,313,035 B1 * | 11/2001 | Sandhu et al. ............... 438/681 |
| 6,492,528 B1 * | 12/2002 | Matsuba et al. ........... 548/316.4 |
| 6,537,613 B1 | 3/2003 | Senzaki et al. |
| 6,613,383 B1 * | 9/2003 | George et al. ................ 427/212 |
| 6,780,476 B2 | 8/2004 | Horikawa |
| 6,780,704 B1 | 8/2004 | Raaijmakers et al. |
| 6,818,517 B1 | 11/2004 | Maes |
| 6,835,417 B2 * | 12/2004 | Saenger et al. .......... 427/255.28 |
| 6,849,305 B2 | 2/2005 | Bravo-Vasquez et al. |
| 6,858,546 B2 * | 2/2005 | Niinisto et al. ............... 438/785 |
| 7,045,170 B1 * | 5/2006 | Hankins et al. .......... 427/255.18 |
| 7,045,430 B2 | 5/2006 | Ahn et al. |
| 7,268,047 B2 | 9/2007 | Arikado et al. |
| 7,507,848 B2 | 3/2009 | Gordon |
| 2005/0271813 A1 | 12/2005 | Kher |
| 2006/0211259 A1 | 9/2006 | Maes et al. |
| 2006/0228888 A1 | 10/2006 | Lee et al. |

FOREIGN PATENT DOCUMENTS

| | | | |
|---|---|---|---|
| GB | 2332980 A | | 7/1999 |
| JP | 53148282 A | * | 12/1978 |
| JP | 60065712 A2 | | 4/1985 |
| JP | 03082769 A | * | 4/1991 |
| JP | 3286531 A2 | | 12/1991 |
| JP | 06080413 A | * | 3/1994 |
| WO | WO 01/99166 A1 | | 12/2001 |

(Continued)

OTHER PUBLICATIONS

Patent Abstracts of Japan. English Abstrat of JP 03-082769 (1991).*

(Continued)

Primary Examiner—Robert M Kunemund
Assistant Examiner—Matthew J Song
(74) Attorney, Agent, or Firm—Knobbe Martens Olson & Bear LLP

(57) ABSTRACT

Process for producing silicon oxide containing thin films on a growth substrate by the ALCVD method. In the process, a vaporisable silicon compound is bonded to the growth substrate, and the bonded silicon compound is converted to silicon dioxide. The invention comprises using a silicon compound which contains at least one organic ligand and the bonded silicon compound is converted to silicon dioxide by contacting it with a vaporised, reactive oxygen source, in particular with ozone. The present invention provides a controlled process for growing controlling thin films containing $SiO_2$ with sufficiently short reaction times.

29 Claims, No Drawings

FOREIGN PATENT DOCUMENTS

WO  WO 2004/017378  2/2004

OTHER PUBLICATIONS

Niinisto et al. "Sysnthesis of oxide thin films and overlayers by atomic layer epitaxy for advanced applications", Materials Science & Enginerring B 41 (1996) pp. 23-29.*

George et al. "Atomic layer controlled deposition of SiO2 and Al2O3 using ABAB . . . binary reaction sequence chemistry" Applied Surface Science 82/83 (1994) pp. 460-467.*

Klaus et al "Atomic Layer Deposition of SiO2 using Catalyzed and uncatalyzed Self-Limiting Surface Reactions" Surface Review and Letters, vol. 6, Nos. 3 & 4 (1999) pp. 435-448.*

George et al. "Surface Chemistry for Atomic Layer Growth", J. Phys. Chem. 1996, 100, pp. 13121-13131.*

Patent abstracts of Japan. English abstract and Translation of JP 06-080413A (1994).*

Derwent. English Abstract of JP 53148282A (1978).*

Juvaste et al., "Aminosilane as a coupling agent for cyclopentadienyl ligands on silica", Journal of Organometallic Chemistry 587 (Sep. 1999) p. 38-45.*

Klaus, J. W el al , "Atomic Layer Deposition of SiO$_2$ Using Catalyzed and Uncatalyzed Self-Limiting Surface Reactions," *Surface Review and Letters*, vol. 6, Nos. 3 & 4, pp. 435-448 (1999).

Niinistö, L. et al., "Synthesis of oxide thin films and overlayers by atomic layer epitaxy for advanced applications." *Materials Science and Engineering*, B41, pp. 23-29 (1996).

Wise, M. L. et al., "Diethyldiethoxysilane as a New Precursor for SiO$_2$ Growth on Silicon," *Mat. Res. Soc. Symp. Proc.*, vol. 334, pp. 37-43 (1994).

Yamaguchi, Kei-ichi et al., "Atomic-layer chemical-vapor-deposition of silicon dioxide films with an extremely low hydrogen content. ", *Appl. Surf. Science*, 130-132; pp. 202-207 (1998).

George, S.M., et al., "Surface Chemistry for Atomic Layer Growth," *J. Phys. Chem.*, 100 13121-13131 (1996).

George, S.M et al., "Atomic layer controlled deposition of SiO2 and Al2O3 using ABAB . . . binary reaction sequence chemistry," *Appl. Surf. Science*, 82/83:460-467 (1994).

Jeon, H., "A Study on the Characteristics of TiN Thin Film Deposited by Atomic Layer Chemical Vapor Deposition Method," *AVS 46$^{th}$ International Symposium*, Seattle, WA, abstract TF-MoP17 (1999).

Jeon, H., et al., "A Study on the Characteristics of TiN Thin Film Deposited by Atomic Layer Chemical Vapor Deposition Method," *J. Vac .Sci. Technol. A*, 18(4), 1595-1598 (2000).

Klaus, J.W., et al., "Atomically controlled growth of tungsten and tungsten nitride using sequential surface reactions," *Appl. Surf. Science* 162-163: 479-471 (2000).

Klaus, J.W., et al., "Atomic layer deposition of tungsten nitride films using sequential surface reactions," *Journal of the Electrochemical Soc.*, 147 (3):1175-1181 (2000).

Klaus, J.W., et al., "Atomic layer deposition of tungsten using sequential surface chemistry with a sacrificial stripping reaction," *Thin Solid Films*, 360:145-153 (2000)n.

Klaus, J.W., et al., "Atomic layer deposition of tungsten and tungsten nitride using sequential surface reactions," *AVS 46$^{th}$ International Symposium*, Seattle, WA, abstract TF-TuM6 (1999).

Riihelä, D. et al , "Introducing atomic layer epitaxy for the deposition of optical thin films," *Thin Solid Films*, vol. 289. pp. 250-255 (1996).

Leskela et al., "ALD precursor chemistry: Evolution and future challenges," *J. Phys. IV France* 9: 837-847 (1999).

Office Action for U.S. Appl. No. 11/221,574 dated Oct. 16, 2008.

Esaki, L.; R. Tsu. "Superlattice and Negative Differential Conductivity in Semiconductors," *IMB J. Res. Develop.*, Jan. 1970.

Gasser et al., "Quasi-monolayer deposition of silicon dioxide", Thin Solid Films, 250 (1994) p. 213-218.

Leskela et al., "Atomic Layer Epitaxy in Deposition of Various Oxide and Nitride Thin Films" *Journal De Physique IV* vol. 5: 937-951 (1995).

Morishita et al, "New Substances for Atomic-Layer Deposition of Silicon Dioxide," *Journal of Non-Chrystalline Solids*, 187 (1995) p. 66-69.

Nieminen et al., "Formation and Stability of Ianthanum oxide thin films deposited from β-diketonate precursor" *Applied Surface Science* 6915: 1-12 (2001).

Putkonen et al., "Low-Temperature ALE Deposition of Y2O3 Thin films from β-Diketonate Precursors" *Chemical Capor Deposition* 44-50 (2001).

Ritala et al., "Growth of titanium dioxide thin films by atomic layer epitaxy" *Thin Solid Films* 225: 288-295 (1993).

Ritala et al., "Zirconium dioxide thin films deposited by ALE using zirconium tetrachloride as precursor" *Applied Surface Science* 75: 333-340 (1994).

Suntola, "Atomic Layer Epitaxy", Dec. 1989, Materials Science Reports, vol. 4, Num. 7, pp. 261-312.

* cited by examiner

ATOMIC-LAYER-CHEMICAL-VAPOR-DEPOSITION OF FILMS THAT CONTAIN SILICON DIOXIDE

REFERENCE TO RELATED APPLICATIONS

The present application is a U.S. national phase application under 35 U.S.C. §371, based on PCT/FI00/01072, filed Dec. 4, 2000, and claims priority under 35 U.S.C. §119 to Finnish Patent Application Number FI19992616, filed Dec. 3, 1999.

The present invention relates to a method according to the preamble of claim 1 of producing oxide films.

According to such a method a thin film containing silicon dioxide is produced on a growth substrate by an ALD method by bonding a vaporisable silicon compound onto the growth substrate and converting the bonded silicon compound to silicon dioxide.

The invention also relates to a method according to the preamble of claim 20 of producing multicomponent oxides (i.e. mixed oxides or tertiary oxides).

The continual decrease in the size of microelectronics components is leading into a situation in which $SiO_2$ can no longer be used as the gate dielectric (gate oxide) of MOSFET (metal-oxide-semiconductor field-effect transistor) since for achieving required capacitances the $SiO_2$ layer should be made so thin that the tunneling current increases disadvantageously high from the functional point of view of the component. To avoid the problem $SiO_2$ has to be replaced by a dielectric material with higher dielectric constant. In that case a thicker layer of the dielectric material than $SiO_2$ can exist. Similarly the capacitance of DRAM (Dynamic Random Access Memory) capacitors must remain nearly constant meanwhile their decrease expeditiously in size, thus the previously used $SiO_2$ and $Si_3N_4$ have to be replaced with materials having higher dielectric constants than these.

Materials having sufficiently high dielectric constants are abundant, but the problem is that the considered dielectric should be stable on the silicon surface, should most preferably be amorphous and should endure nearly unchanged under high post-treatment temperatures. Especially in the gate dielectric application a state where electrically active defects are rare should be provided at the interface of silicon and the high permittivity metal oxide. In the memory application the structure of the capacitor dielectric must be very stable due to the applied high activation temperatures. Due to the above mentioned facts it is preferable to admix $SiO_2$ to the metal oxide with a higher dielectric constant.

In its various forms Chemical Vapor Deposition (CVD) is the most frequently used method of producing silicon dioxide (see patent publications JP 9306906, U.S. Pat. No. 4,845,054, U.S. Pat. No. 4,981,724, U.S. Pat. No. 5,462,899, JP 20868486, JP 6158329, JP 80061810, U.S. Pat. No. 4,872, 947, JP 7026383, U.S. Pat. No. 5,855,957 and U.S. Pat. No. 5,849,644). Mainly tetraethoxy silane (TEOS) has been used as the silicon source material, and oxygen, water, hydrogen peroxide or ozone have been used as the oxygen source material in the patent publications. In the conventional CVD the oxygen source material is always brought simultaneously with the silicon source material to the growth substrate.

The conventional CVD method is related to the difficulty of controlling the process, and neither a sufficiently good coverage with the thin layers nor a good conformality is always achieved by CVD.

The invention is based to the idea that thin films containing silicon dioxide are produced by the Atomic Layer Chemical Vapor Deposition (ALCVD) process, which is generally known also as Atomic Layer Epitaxy (ALE) or Atomic Layer Deposition (ALD).

ALD is a current method of growing thin films (U.S. Pat. No. 4,058,430). According to the method a thin film is grown by means of saturable surface reactions, which are well separated from each other. The saturation is provided by means of chemisorption. In other words, the reaction temperature is selected as that the gaseous source material is stable at the growth temperature and additionally, it does not condense or decompose on the surface but is capable to react selectively with the reactive sites of the surface, e.g., with the OH groups or oxygen bridges (M—O—M) present on the oxide surface. OH groups functioning as reactive sites a so-called ligand exchange reaction takes place in which a covalent bond is formed between the surface and the source material (chemisorption). When the oxygen bridges are concerned a dissociating reaction takes place in which reaction a covalent bond is also formed (chemisorption). The bond formed by chemisorption is very strong and the surface structure formed on the surface is stable which enables the saturation of the surface by one molecular layer. The ligand exchange reactions are carried out by leading the gaseous or vaporized source materials alternately into the reactor and by purging the reactor with an inert gas between the pulses of the source materials (T. Suntola, Thin Solid Films 215 (1992) 84; Niinistö et al. Materials Science and Engineering B 41 (1996) 23). Also even and uniform films can be grown by ALCVD even on large surface areas. Accordingly films can be grown on both even and heterogeneous surface as well as on a grooved surface. Controlling the thickness and the composition of the film by means of the number of reaction cycles is precise and simple.

Silicon dioxide has also been grown by the ALD process. Compounds $Si(NCO)_4$ and $N(C_2H_5)_3$ (K. Yamaguchi et al., Appl. Surf. Sci. (1998) 130-132) have been used as source materials. Producing silicon dioxide by Molecular Layer ALE and UHV-ALE processes using $SiCl_4$ and $H_2O$ as source materials is also known in the literature (Surface Review and Letters, Vol. 6, Nos 3 & 4 (1999) 435-448).

The disadvantages of these known solutions are long reaction times, for what reason the proposed processes cannot be realized on an industrial scale.

The objective of the present invention is to eliminate the disadvantages related to the prior art and to provide a novel method, which enables a controlled growth of $SiO_2$ containing thin films with sufficiently short reaction times.

The invention is based to the discovery that the above mentioned objectives can be achieved by using a silicon compound containing an organic ligand as the silicon source and a reactive oxygen source, such as ozone, as the oxygen source material. Multicomponent oxides in which the amount of silicon dioxide can be varied in a controlled way can easily be prepared by the proposed solution.

Furthermore, in the connection of the invention it has surprisingly been found that while growing multicomponent oxides, i.e. "tertiary oxides", by the ALD method from the corresponding source materials of silicon and some other semimetal or metal and by using suitable oxygen sources the growth rate of the multicomponent oxide is higher than that of either individual oxide. According to the invention the multicomponent oxides are therefore prepared by binding from the gas phase a suitable, vaporised silicon compound onto the growth substrate, converting the bonded silicon compound to silicon dioxide, bonding from the gas phase a vaporised metal compound or a vaporised compound of another semimetal onto the growth substrate and converting the bonded metal compound or the compound of another semimetal to a corresponding oxide whereby the silicon compound and the compound of another semimetal and/or metal are bonded onto the growth substrate in a desired order.

More precisely, the method for preparing oxide films according to the first embodiment of the invention is characterized by what is stated in the characterizing part of claim 1.

The method of preparing multicomponent oxide films according to the invention is in turn characterized by what is stated in the characterizing part of claim 20.

Remarkable advantages are achieved with the aid of the invention. Thus, the ALD process provides a possibility for growing a multistaged interlayer containing both silicon dioxide and metal oxide prior to growing the actual metal oxide, which has a high dielectricity. The stability of the capacitor dielectric can be increased by mixing amorphous silicon dioxide into the dielectric. The preparing of multicomponent oxides and the advantages achieved thereof are described in more detail below.

It is to be noted that with the aid of the invention also pure silicon dioxide films can however be prepared. Such a silicon dioxide material can be used further in so-called STI (shallow trench isolation) structure. The function of STI is to isolate the transistors from each other in both the circuit and memory structures. At present in the lateral direction wide so-called LOCOS isolation is in use, which isolation is not suitable in the future circuits because of its bulkiness. In STI technology a horizontal narrow deep trench filled with dielectric=silicon dioxide, is etched between the circuits. Since the depth of the trench is greater than the width STI requires a method which is capable of filling the etched isolation trench conformally. By the conventional CVD method STI trenches can be filled but often the trench has to be widened in the upper part in order to avoid void formation in the middle of the STI isolation. Enlargement of the trench leads to increase of the STI area, i.e. the area of the isolation area increases. ALD is an especially suitable process for producing STI because ALD is characterized by the ability to grow silicon dioxide of uniform quality and without void formation on uneven growth substrates, especially also onto narrow trenches. Using ALD enables thus a narrower isolation area between the circuits whereby the packing density of the circuits can be increased.

In the components needed in magnetic recording silicon dioxide can be used as the isolation layer in both the writing/reading head and in the encapsulation of the writing/reading head. In order to avoid the destruction of the magnetic properties of the layers, that are already built, the processing temperature must be low in all steps. In general, physical (sputtering) methods are used in the field, the problem of said methods being the unevenness of produced film. ALD has the capability to produce both physically and electrically homogenous thin film. It is especially preferable to use a low temperature ALD silicon dioxide process that provides a uniformly covering and electrically homogenous $SiO_2$ thin film. In this way the reproducibility and reliability of this process step can be increased.

In the field emission displays (FED) film deposition methods producing uniform thin film on a large surface are needed. Due to the low growth temperature and the uniformity of the silicon dioxide film produced the ALD silicon dioxide process is very suitable for preparing the dielectric layer for the field emission displays.

By using especially reactive oxygen sources such as ozone, peroxide and oxygen radicals for converting the bonded silicon compound the forming temperature of silicon dioxide can be significantly decreased. According to the invention it can be operated especially at a temperature lower than 450° C., most preferably at 400° C. at the most. In that case the whole growing cycle can also be accomplished at the same temperature, which has a great significance for industrial processing. Additionally, by using these reactive oxygen sources a very wide group of organic silicon compounds, which are not possible to be converted by e.g. water, become available.

In the following the invention is viewed more closely with the aid of a detailed description.

In the solution according to the invention silicon dioxide thin films and films mixed with silicon dioxide are grown in the ALD reactor preferably at the temperature of 150-450° C. Even flat (such as glass or wafer) or grooved flat materials can be used as a substrate. On the surface of the substrate can also exist a so-called HSG (hemispherical grain) structure on which the film is grown. Additionally, a powdery material, which has a large surface area, can be used as a substrate. The term "growth substrate" designates in this invention the surface on which the thin film is grown. The surface can consist of the above mentioned substrate or of a thin film grown onto the substrate or of another structure.

According to the ALD process the silicon source material is vaporised and led onto the substrate on which it reacts and forms via a ligand exchange reaction or dissociation reaction one chemisorbed molecular layer on the surface. After the reaction the reaction space is purged carefully with an inert gas to remove the unreacted source material and reaction products from the reaction space. In the connection of this invention vaporisable compounds of silicon, which contain at least one organic ligand, are used as the silicon source material. "Organic ligand" designates a hydrogen carbyl group, which is derived from an organic compound. Such a ligand has thus itself a C—C bond (e.g. an ethyl group) or it is bonded via carbon to the silicon atom or it has a C—H bond(s). According to a preferred embodiment silane, siloxane or silazane are used as vaporisable silicon compounds. These are commercially available compounds.

Especially preferably a silicon compound, which has a boiling point of 400° C. at the most at a pressure of 10 mbar is selected. Thus the ALD process can be carried out in the above mentioned preferred temperature range of 150-400° C.

The following can be mentioned as examples of the preferred silane, siloxane and silazane compounds:

Silanes of the Formula $$Si_mL_{2m+2} \tag{I}$$

wherein m is an integer 1-3,

Siloxanes of the Formula $$Si_yO_{y-1}L_{2y+2} \tag{II}$$

wherein y is an integer 2-4, and

Silazanes of the Formula $$Si_yNH_{y-1}L_{2y+2} \tag{III}$$

wherein y is an integer 2-4.

In formulae (I)-(III) each L can independently be F, Cl, Br, I, alkyl, aryl, alkoxy, vinyl (—CH═CH$_2$), cyano (—CN), amino, silyl (H$_3$Si—), alkylsilyl, alkoxysilyl, silylene or alkylsiloxane whereby alkyl and alkoxy groups can be linear or branched and contain at least one substituent. Typically alkyl and alkoxy groups contain 1-10 carbon atoms, most preferably 1-6 carbon atoms.

As examples of especially preferred silicon compounds amino-substituted silanes and silazanes, such as 3-aminoalkyltrialkoxy silanes, for example 3-aminopropyltriethoxy silane NH$_2$—CH$_2$CH$_2$CH$_2$—Si(O—CH$_2$CH$_3$)$_3$ (AMTES) and 3-aminopropyltrimethoxy silane ($NH_2$—$CH_2CH_2CH_2$—$Si(O$—$CH_3)_3$ (AMTMS) and hexa-alkyldisilazane $(CH_3)_3Si$—$NH$—$Si(CH_3)_3$ (HMDS) can be mentioned.

The silicon compound can also be formed during the ALD process in the connection of gas-phase reactions so that while the silicon compound is bonding, a new gas-phase silicon compound is formed which in turn is able to bond to the hydroxyl and, optionally oxide groups of the growth substrate. In this invention this phenomenon is called "in situ" formation of silicon compound. Such an in situ formed silicon compound comprises typically a silane compound, e.g. a silane compound which has a formula $SiL_1L_2L_3L_4$, wherein $L_1$ represents an amino group and $L_2$-$L_4$ represent alkyl or alkoxy group. This silane compound is formed e.g. when the growth substrate is contacted with hexa-alkyldisilazane at 350-450° C. at the pressure of 0, 1-50 mbar.

After bonding the silicon compound a suitable reactive oxygen source is introduced into the reaction space, said oxygen source providing the conversion of the silicon compound to silicon dioxide on the growth surface. In the following the invention is described more closely having ozone as an example. It must however be noted that instead of ozone also other oxygen source materials, listed below more precisely, can be used in many cases. Using ozone numerous advantages are however to be achieved as far as the spectrum of the silicon compounds used and the processing temperature are concerned.

Ozone, which is introduced into the reaction space, reacts with the ligands of the chemisorbed silicon source material forming OH groups and oxygen bridges on the surface. In other words ozone combusts the organic ligands and water formed in the combustion reaction forms further OH groups. After the reaction the reaction space is purged very carefully again with an inert gas to remove the unreacted ozone and the reaction products. These four steps together form one growth cycle. The growth cycle is repeated until the film has the desired thickness.

A multicomponent film is achieved by changing the source material, i.e. by growing some other oxide onto the growth substrate between silicon dioxide growth cycles. From the point of view of the invention the growth order of the oxide compounds can be optional.

A multicomponent oxide, usually $MSiO_x$, is grown by vaporising the metal source material and leading the vaporised metal source material onto the substrate on which it reacts forming one molecular layer on the surface via a ligand exchange reaction and/or dissociation reaction. After the reaction the reaction space is purged carefully with an inert gas to remove the unreacted source material and the reaction products from the reaction space. After this the oxygen source material is led into the reaction space, said oxygen source material reacting with the remaining ligands (e.g. chloride ligands) of the chemisorbed metal compound complex (e.g. zirconium complex) forming new OH groups and oxygen bridges on the surface. After the reaction the reaction space is purged again carefully. In the next step the above-described growing cycle of silicon dioxide can be carried out.

In the case of a multicomponent oxide any of the above mentioned silicon source materials can be used as the silicon compound. It must, however, be noted that also the halide compounds of silicon (silicon tetrachloride, silicon tetrafluoride, silicon tetraiodide etc.) as well as the above mentioned amino compounds of silicon are, however, suitable for being used as silicon source materials. Any of the below specified oxygen sources can be used as the oxygen source, most preferably, however, water or ozone.

One or more metals or semimetals can function as the second cation of the multicomponent oxide (i.e. tertiary oxide). Metals belonging to the groups IIIa, IVa and Va (transition metals) of the periodic table of the elements including the rare earth metals, i.e. lanthane and lanthanoids, as well as the metals and semimetals of group IVb can especially be mentioned of the metals.

As the source material for the metal or semimetal (e.g. germanium) any stable vaporisable compound of metal in question can be used. In the example case (see example 2) the following metal source materials were used: aluminium chloride as aluminium source material, titanium tetrachloride ($TiCl_4$) as titanium source material, tantalum pentachloride ($TaCl_5$) as tantalum source material, hafnium tetrachloride ($HfCl_4$) as hafnium source material, zirconium tetrachloride ($ZrCl_4$) as zirconium source material, yttrium betadiketonate ($Y(thd)_3$) as yttrium source material and lanthanum betadiketonate ($La(thd)_3$) as lanthanum source material. In the example cases water steam ($H_2O$) was used as the oxygen source with aluminium, titanium, zirconium and hafnium and tantalum source material and ozone ($O_3$) was used as the oxygen source with lanthanum and yttrium source material.

Multicomponent films containing various concentrations of silicon dioxide, e.g. $SiAlO_x$, $SiTiO_x$, $SiTaO_x$, $SiHfO_x$, $SiZrO_x$, $SiYO_x$, $SiLaO_x$, can be grown according to the invention by changing the number of reaction cycles of the silicon source material and ozone. In the formulae above the amount of oxide can vary and the oxide is not always completely stoichiometric.

The ratio of the amount of the metal oxide and silicon dioxide cycles can be varied. The number of cycles of the metal oxide can vary between 1-1000 and that of silicon dioxide between 1-1000. Preferably the number of cycles of the metal oxide varies between 1-50 and that of silicon dioxide between 1-50. By varying the metal oxide cycle/silicon dioxide cycle ratio in question e.g. between 10:1 . . . 1:10 the nature of the mixed oxide can be varied in a controlled way from a complete mixed oxide to a nanolaminate structure.

In growing of multicomponent oxides it has been found that the growth rate of the multicomponent oxide is higher than that of either individual oxide from which the multicomponent oxide is formed. For example the growth rate of $La_2O_3$ from $La(thd)_3$ and ozone as well as the growth rate of $Y_2O_3$ from $Y(thd)_3$ and ozone is 0.2 Å/cycle which is at the same time equal to the growth rate of $SiO_2$ from 3-aminopropylmethoxy silane and ozone. By preparing the mixed oxide of these metal oxides mentioned above with silicon dioxide using the cycle ratio of 1:1 a growth rate of more than threefold, 0.7 Å/cycle, is achieved.

Any oxygen compound suitable for using in the ALD technology can function as the oxygen source in the above silicon dioxide and multicomponent oxide processes. Preferred oxygen source materials are for example water, oxygen and hydrogen peroxide and the aqueous solutions of hydrogen peroxide. Most preferably such oxygen sources are used which are more reactive than water towards silicon compound which contains an organic ligand. As mentioned above an especially preferred oxygen source material is ozone ($O_3$). Ozone can be produced by an ozone generator and it is most preferably introduced into the reaction space with the aid of nitrogen gas (or inert gas of same kind) whereby the concentration of ozone is about 1-30 vol.-%, preferably about 2-25 vol.-%.

By using ozone as the source material organic ligands of silicon source material, said ligands forming a linear Si—C bond, can be changed at such a temperature in which the other possible ligands of the silicon source material, for example alkoxy ligands, which form a Si—O—C bond are not uncontrolled decomposing.

One or more of the following compounds can also be used as the oxygen source material:
- oxides of nitrogen, such as $N_2O$, NO and $NO_2$,
- oxyhalide compounds, for example chlorodioxide ($ClO_2$) and perchloroacid ($HClO_4$),
- peracids (—O—O—H), for example perbenzoic acid ($C_6H_5COOOH$) and peracetic acid ($CH_3COOOH$),
- alcohols, such as methanol ($CH_3OH$) and ethanol ($CH_3CH_2OH$), and
- various radicals, for example oxygen radical (O..) or hydroxyl radical (.OH).

The following non-limiting examples illustrate the invention:

EXAMPLE 1

$SiO_2$ films were grown in a flow type F-120 ALCVD™ reactor (ASM Microchemistry Ltd.). 3-aminopropyltriethoxy silane $NH_2$—$CH_2CH_2CH_2$—$Si(O$—$CH_2CH_3)_3$ (AMTES), 3-aminopropyltrimethoxy silane ($NH_2$—$CH_2CH_2CH_2$—$Si(O$—$CH_3)_3$ (AMTMS) and hexamethyldisilazane $(CH_3)_3Si$—NH—$Si(CH_3)_3$ (HMDS) were used as the silicon source material. Ozone ($O_3$) was used as the oxygen source material. AMTES and AMTMS were inside of the reactor. Ozone and HMDS were led into the reactor from outside. The reaction temperature of AMTES was 200 or 300° C., that of AMTMS 300° C. and HMDS 400° C.

The growing of $SiO_2$ from AMTES was carried out with the aid of alternating AMTES and ozone pulses between of which the reaction space was purged carefully so that the source materials would not be simultaneously present in the reaction space. The duration of the AMTES pulse was 1.0 s and that of the purging pulse 2 s. The duration of the ozone pulse was 4.0 s and the duration of the purging pulse 4.0 s. The growth rate of $SiO_2$ was 0.15 Å/reaction cycle at the reaction temperature of 300° C. and 0.28 Å/cycle at the reaction temperature of 200° C. The refractive index of silicon dioxide grown at 300° C. was 1.4. Using AMTMS as the source material the pulsing times were 0.5 s, 0.5 s, 2.0 s and 1.0 s, respectively, and the growth rate was 0.16 Å/reaction cycle.

The growing of $SiO_2$ from HMDS was carried out in the same way as above. The duration of the HMDS pulse was 0.5 s and that of the purging pulse 2 s. The duration of the ozone pulse was 2.5 s and that of the purging pulse 1 s. The growth rate was 0.17 Å and the value of the refractive index varied between 1.48-1.57.

Based on the results, ozone can be used together with the vaporisable silicon source material for growing silicon dioxide by the ALD process. Of the silicon source materials the advantage of AMTES and AMTMS is the low reaction temperature when ozone is used as the oxygen source. This enables further the preparing of multicomponent oxides since other than metal chlorides do not stand reaction temperatures above 350° C. without decomposing.

EXAMPLE 2

Multicomponent oxides were grown in the above reactor using AMTMS as the silicon source material. In the growing processes the AMTMS pulse was 0.5 s, the purging pulse 0.5 s, the ozone pulse 3.5 s and the purging pulse 1 s. The pulse of the metal source material was correspondingly 0.5 s and the purging pulse 0.5 s. If water was used as the oxygen source the duration of the water pulse was 0.2 s and that of the purging pulse 0.5 s. Using ozone with the metal source material the duration of the ozone pulse was 3.5 s and that of the purging pulse 0.5 s. The growth rates and cycle ratios are shown in the table below.

| Multicomponent oxide | Metal source material | Total amount of cycles/Cycle ratio (M:S) | Growth rate Å/cycle |
|---|---|---|---|
| SiTiOx | $TiCl_4$ | 1800/(1:1) | 0.9 |
| SiTaOx | $TaCl_5$ | 1800/(1:1) | 1.1 |
| SiHfOx | $HfCl_4$ | 700/(1:1) | 1.23 |
| SiZrOx | $ZrCl_4$ | 700/(1:1) | 1.1 |
| SiZrOx (repeat) | $ZrCl_4$ | 700/(1:1) | 1.1 |
| SiAlOx | $Al(CH)_3$ | 1900/(1:1) | 1.0 |
| SiLaOx | $La(thd)_3$ | 1100/(1:1) | 0.75 |
| SiYOx | $Y(thd)_3$ | 1100/(1:1) | 0.73 |
| SiYOx | $Y(thd)_3$ | 2200/(2:2) | 0.74 |
| SiYOx | $Y(thd)_3$ | 2200/(5:5) | 0.72 |
| SiYOx | $Y(thd)_3$ | 2200/(10:10) | 0.70 |
| SiYOx | $Y(thd)_3$ | 2200/(20:20) | 0.64 |
| SiYOx | $Y(thd)_3$ | 2240/(40:40) | 0.20 |

M = number of the cycles of the metal source material, S = number of the cycles of the silicon source material The multicomponent samples were analyzed by ESCA (electron spectroscopy for chemical analysis). The thin film samples were analyzed in three different sites showing that the multicomponent oxides were very homogenous. Furthermore, the multicomponent oxides were very uniform which is typical for the ALD process when the chemistry of the growing is favourable.

The invention claimed is:

1. An atomic layer deposition (ALD) process for producing a thin film comprising silicon dioxide on a substrate by alternating, saturating surface reactions, the process comprising:
   contacting a substrate in a flow type reactor with a vaporized silicon compound selected from the group consisting of amino substituted silanes and silazanes, wherein a substrate temperature is selected such that the silicon compound chemisorbs to the substrate to form a single molecular layer and does not condense or decompose on the substrate, said silicon compound comprising at least one organic ligand;
   removing unreacted silicon compound; and
   converting the chemisorbed silicon compound into silicon dioxide by contacting it with a reactive vaporized oxygen source compound, wherein the reaction temperature is selected such that the silicon compound does not condense or decompose on the substrate surface;
   wherein the vaporized silicon compound and the reactive vaporized oxygen source compound are the only reactants used to form the silicon dioxide; and
   wherein when each reactant is contacting the substrate, the reactant flows continuously from an inlet of the reactor to an outlet of the reactor.

2. The process of claim 1, wherein the boiling point of the silicon compound is less than or equal to 400° C. at a pressure of 10 mbar.

3. The process of claim 1, wherein the silicon compound is selected from the group consisting of silicon compounds of the formula:

$$Si_yNH_{y-1}L_{2y+2}, \quad (I)$$

wherein y is an integer from 2 to 4
and each L can independently be F, Cl, Br, I, alkyl, aryl, alkoxy, vinyl (—CH=$CH_2$), cyano (—CN), amino, silyl ($H_3Si$—), alkylsilyl, alkoxysilyl, silylene or alkylsiloxane, wherein the alkyl and alkoxy groups can be linear or branched and contain at least one substituent, with the proviso that at least one L is an organic ligand.

4. The process of claim 1, wherein the silicon compound comprises both an alkyl and an alkoxy group, at least one of which may be substituted.

5. The process of claim 4, wherein the silicon compound is selected from the group consisting of 3-aminoalkyltrialkoxy silane and hexa-alkyldisilazane, wherein the alkyl and alkoxy groups comprise from 1 to 10 carbon atoms.

6. The process of claim 1, wherein the substrate comprises hydroxyl groups on the surface thereof that are reactive with the silicon compound.

7. The process of claim 6, wherein a second silicon compound that is capable of reacting with the hydroxyl groups is formed in situ.

8. The process of claim 7, wherein the second silicon compound is a silane.

9. The process of claim 8, wherein the formula of the silane is $SiL_1L_2L_3L_4$, wherein $L_1$ represents an amino group and $L_2$-$L_4$ represent alkyl or alkoxy groups.

10. The process of claim 7, wherein the second silicon compound is formed by contacting the substrate with hexa-alkyldisilazane at 350-450° C. at a pressure of 0.1-50 mbar.

11. The process of claim 1, wherein the substrate comprises oxide groups on the surface thereof that are reactive with the silicon compound.

12. The process of claim 1, wherein the reactive oxygen source compound is selected from the group consisting of water, oxygen, hydrogen peroxide, an aqueous solution of hydrogen peroxide, ozone and a mixture thereof.

13. The process of claim 1, wherein the reactive oxygen source compound is a nitrogen oxide.

14. The process of claim 13, wherein the reactive oxygen source compound is selected from the group consisting of $N_2O$, NO and $NO_2$.

15. The process of claim 1, wherein the reactive oxygen source compound is selected from the group consisting of oxyhalides, peracids (—O—O—H), alcohols, oxygen radicals (O..) and hydroxyl radicals (.OH).

16. The process of claim 15, wherein the oxyhalide is selected from the group consisting of chlorine dioxide ($ClO_2$) and perchloro acid ($HClO_4$).

17. The process of claim 15, wherein the peracid is selected from the group consisting of perbenzoic acid ($C_6H_5COOOH$) and peracetic acid ($CH_3COOOH$).

18. The process of claim 15, wherein the alcohol is selected from the group consisting of methanol ($CH_3OH$) and ethanol ($CH_3CH_2OH$).

19. The process of claim 1, wherein the bonded silicon compound is converted into silicon dioxide by contacting it with ozone-containing gas having a ozone concentration of 1-30 vol.-%.

20. The process of claim 1, wherein contacting the substrate with a vaporized silicon compound and converting the bonded silicon compound into silicon dioxide are both performed at essentially the same temperature.

21. The process of claim 1, wherein the thin film consists essentially of silicon dioxide.

22. The process of claim 1, wherein the thin film is a multicomponent oxide thin film comprising silicon dioxide and one or more additional oxides.

23. The process of claim 22, wherein the additional oxide is selected from the group consisting of zirconium oxide, titanium oxide, hafnium oxide, tantalum oxide, aluminum oxide, yttrium oxide and lanthanum oxide.

24. The process of claim 23, wherein the additional oxide is produced by contacting the substrate with a halide compound selected from the group consisting of vaporized halide compounds of zirconium, aluminum, titanium, hafnium, and tantalum, such that the halide compound bonds to the substrate and converting the bonded halide compound into an oxide by contacting it with a vaporized reactive oxygen source compound.

25. The process of claim 24, wherein the reactive oxygen source compound comprises water.

26. The method of claim 1, wherein the reactive vaporized oxygen source compound is not water.

27. An atomic layer deposition (ALD) process for producing a thin film comprising silicon dioxide on a substrate by alternating, saturating surface reactions, the process comprising:
   contacting a substrate in a flow type reactor with a vaporized silicon compound selected from the group consisting of amino substituted silanes and silazanes, said silicon compound comprising at least one organic ligand;
   removing unreacted silicon compound; and
   contacting the substrate with an ozone-containing gas;
   wherein the vaporized silicon compound and the ozone-containing gas are the only reactants used to form the silicon dioxide; and
   wherein when each reactant is contacting the substrate, the reactant flows continuously from an inlet of the reactor to an outlet of the reactor.

28. The process of claim 27, wherein the ozone-containing gas has a ozone concentration of 1-30 vol.-%.

29. The process of claim 27, wherein the ozone-containing gas has a ozone concentration of 2-25 vol.-%.

* * * * *

UNITED STATES PATENT AND TRADEMARK OFFICE
CERTIFICATE OF CORRECTION

PATENT NO. : 7,771,533 B2
APPLICATION NO. : 10/148525
DATED : August 10, 2010
INVENTOR(S) : Tois et al.

Page 1 of 1

It is certified that error appears in the above-identified patent and that said Letters Patent is hereby corrected as shown below:

On Page 1, Column 2, Line 26, please change "Abstrat" to --Abstract--

On Page 2, Column 1, Line 4, please change "Sysnthesis" to --Synthesis--

On Page 2, Column 1, Line 6, please change "Enginerring" to --Engineering--

On Page 2, Column 2, Line 31, please change "Ianthanum" to --lanthanum--

In Column 2, Line 28, please change "ALCVD" to --ALD--

In Column 7, Line 13, please change "(O..)" to --(O )--

In Column 7, Line 14, please change "(.OH)." to --(OH).--

In Column 9, Line 41, please change "(O..)" to --(O )--

In Column 9, Line 41, please change "(.OH)." to --( OH).--

Signed and Sealed this
Eighteenth Day of January, 2011

David J. Kappos
*Director of the United States Patent and Trademark Office*